(12) United States Patent
Rao et al.

(10) Patent No.: US 8,098,540 B2
(45) Date of Patent: Jan. 17, 2012

(54) DYNAMIC POWER SAVING MEMORY ARCHITECTURE

(75) Inventors: Hari Rao, San Diego, CA (US); Yun Du, San Diego, CA (US); Chun Yu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 684 days.

(21) Appl. No.: 12/163,233

(22) Filed: Jun. 27, 2008

(65) Prior Publication Data
US 2009/0323453 A1 Dec. 31, 2009

(51) Int. Cl.
*G11C 11/00* (2006.01)
(52) U.S. Cl. .......... 365/230.05; 365/230.02; 365/230.03
(58) Field of Classification Search ............ 365/189.02, 365/189.04, 230.02, 230.05, 230.03
See application file for complete search history.

(56) References Cited

U.S. PATENT DOCUMENTS

| | | |
|---|---|---|
| 4,590,588 A | 5/1986 | Itoh et al. |
| 4,739,497 A | 4/1988 | Itoh et al. |
| 5,898,637 A * | 4/1999 | Lakhani et al. .......... 365/230.06 |
| 5,933,855 A * | 8/1999 | Rubinstein .................... 711/200 |
| 6,735,104 B2 * | 5/2004 | Scheuerlein .................... 365/51 |
| 6,937,532 B2 | 8/2005 | Hatanaka et al. |
| 2004/0022098 A1* | 2/2004 | Hatanaka et al. ............. 365/200 |

FOREIGN PATENT DOCUMENTS
WO 9636050 11/1996

OTHER PUBLICATIONS

International Search Report—PCT/US2009/047881, International Search Authority—European Patent Office Sep. 21, 2009.
Written Opinion—PCT/US2009/047881, International Search Authority—European Patent Office Sep. 21, 2009.

* cited by examiner

*Primary Examiner* — Richard Elms
*Assistant Examiner* — Hien Nguyen
(74) *Attorney, Agent, or Firm* — Nicholas J. Pauley; Peter M. Kamarchik; Jonathan T. Velasco

(57) ABSTRACT

A memory includes multiple interface ports. The memory also includes at least two sub-arrays each having an instance of all of the bit lines of the memory and a portion of the word lines of the memory. The memory has a common decoder coupled to the sub-arrays and configured to control each of the word lines. The memory also includes multiplexers coupled to each of the interface ports. The multiplexers are configured to cause the selection of one of the sub-arrays based upon an address of a memory cell received at one or more of the interface ports.

16 Claims, 7 Drawing Sheets

DYNAMIC POWER SAVING MEMORY ARCHITECTURE

TECHNICAL FIELD

The present disclosure relates, in general, to memory architecture, and, more particularly, to a memory architecture that reduces dynamic power consumption.

BACKGROUND

Memory provides one of the support infrastructures to modern computer and electronic devices. As memory capacity and density increase per unit of area, smaller devices have generally become more capable of complex and powerful processing, such as the processing of audio, video, graphics, and the like. Many such smaller devices exist as independent, hand-held devices, such as mobile phones, personal digital assistants (PDAs), and the like. Because most, if not all, hand-held devices operate using a battery to provide the primary device power, power management is a high priority in any hand-held device design process, including the design of memory that will be used in such devices.

FIG. 1 is a diagram illustrating a standard semiconductor device 10. The semiconductor device 10 is an integrated chip device containing dual processors, processors 100 and 101, and on-chip memory 102-105. When designing the semiconductor device 10, the various gates and components are often first planned in a computer-aided design environment. The mapping and lithography plans are generated before the semiconductor manufacturer begins actually fabricating the semiconductor device 10. One consideration important to the design is the physical footprint or coverage area within the semiconductor material for each component. This consideration influences the size and overall floor plan of the semiconductor device 10. A floor plan is generally considered the physical blueprint or total coverage area taken up by the combined components of the semiconductor device 10.

The semiconductor device 10 is powered by a battery 106. Thus, the semiconductor device 10 may be a variety of different, special purpose processing systems within a number of different devices, such as mobile phones, PDAs, handheld devices, or the like. Another consideration, as noted above, when designing the semiconductor device 10 is the power consumption traits of each embedded constituent component including the memories 102-105.

The power consumed by such embedded memories is typically measured as a combination of the dynamic or active power and the standby or static power. Standby/static power is generally considered the off-state current leakage that occurs even when the device is considered off. While static power used to be a problem in the hand-held or mobile industry, it has generally been controlled through the use of head switches and foot switches. Dynamic power, however, which is the power consumption based on an application's interaction with a memory, is still considered an area where power savings can be achieved. Because dynamic power relates to how a particular application accesses memory, careful tuning and control are often prompted in order to bring the power down.

SUMMARY

Various representative embodiments of the invention relate to memory components configured to reduce dynamic power consumption. A memory component includes a memory interface for input/output communications, a decoder coupled to the memory interface, at least two memory sub-arrays that include memory cells, bit lines and word lines, and several multiplexers coupled to the memory interface. To accomplish the power reduction, the memory architecture is modified such that each sub-array includes an instance of all bit lines dedicated for that memory component and a portion of all of the word lines dedicated to the memory. Because the length of the bit lines is influenced by the number of word lines in each sub-array, bit lines end up shorter when less than the entire number of word lines are included in each sub-array. The shortened bit lines reduce capacitance, which reduces the dynamic power consumption. The multiplexers are used to assist the selection of the correct sub-array based on at least a part of the address received at the memory interface.

Representative embodiments of the present invention relate to memories that include a plurality of interface ports and at least two sub-arrays, each having an instance of all of the bit lines of the memory and a portion of all of the word lines of the memory. The memory also includes a decoder coupled to the sub-arrays and which is configured to control the word lines. The memory has multiplexers coupled to each of the plurality of interface ports and the decoder. The multiplexers are operable to cause selection of the appropriate sub-array based upon at least a portion of a received memory cell address.

Additional representative embodiments of the present invention relate to methods for manufacturing a memory that includes forming at least two sub-arrays each having a plurality of memory cells, coupling a decoder between each of the sub-arrays, creating a set of bit lines in each of the sub-arrays wherein each set has an instance of the total number of bit lines accessible to the memory, and creating a number of word lines in each of the sub-arrays coupled at one end to the decoder. The number of word lines in each sub-array is less than all of the word lines provided for in the memory. The method also includes forming one or more multiplexers coupled to the decoder and configured to facilitate selection of the appropriate sub-array based on memory address information.

Further representative embodiments of the present invention relate to memories that are made up of a memory interface, a decoder coupled to the memory interface, a first memory block coupled to the decoder and including a first instantiation of all bit lines of the memory and a first portion of a set of all word lines of the memory, and a second memory block coupled to the decoder and including a second instantiation of the all bit lines and a second portion of the set of all word lines. The memory also includes a selector coupled to the memory interface and configured to facilitate selection of one of the first or second memory blocks responsive to information received at the memory interface.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Dynamic power in memory is measured as a combination of the capacitance of the bit line switched at some rate, the supply voltage or swing voltage of the memory, and the frequency of operation, i.e., the frequency that the bit line is actually switched. Dynamic power of a memory can be represented by the following formula:

$$P_{DYN} = CV^2 f\alpha \qquad (1)$$

Where 'C' is the total capacitance switched at a rate 'α,' 'f' is the frequency of operation, and 'V' is the supply voltage of the memory structure. Thus, in order to reduce the dynamic power in a memory structure, any of C, V, f, or α may be decreased.

Reducing voltage, frequency, or rate will decrease dynamic power. However, reducing voltage, frequency, or rate also reduces performance. As such, decreasing capacitance is seen as the more beneficial solution. Because the length of the bit line determines the capacitance of that bit line, capacitance may be reduced by shortening the bit line.

Figure 1:
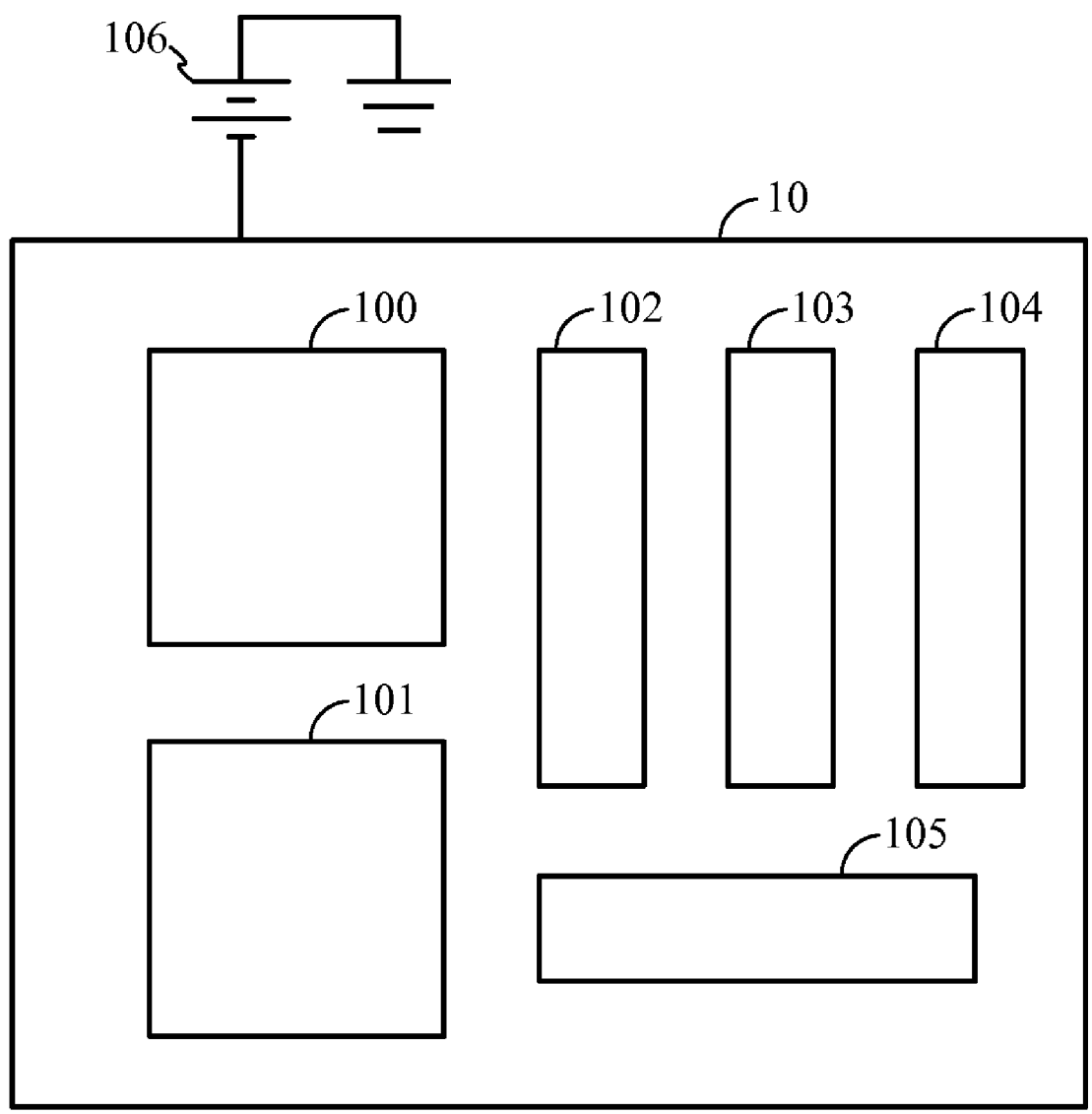
FIG. 1 is a diagram illustrating a standard semiconductor device.
Figure 2:
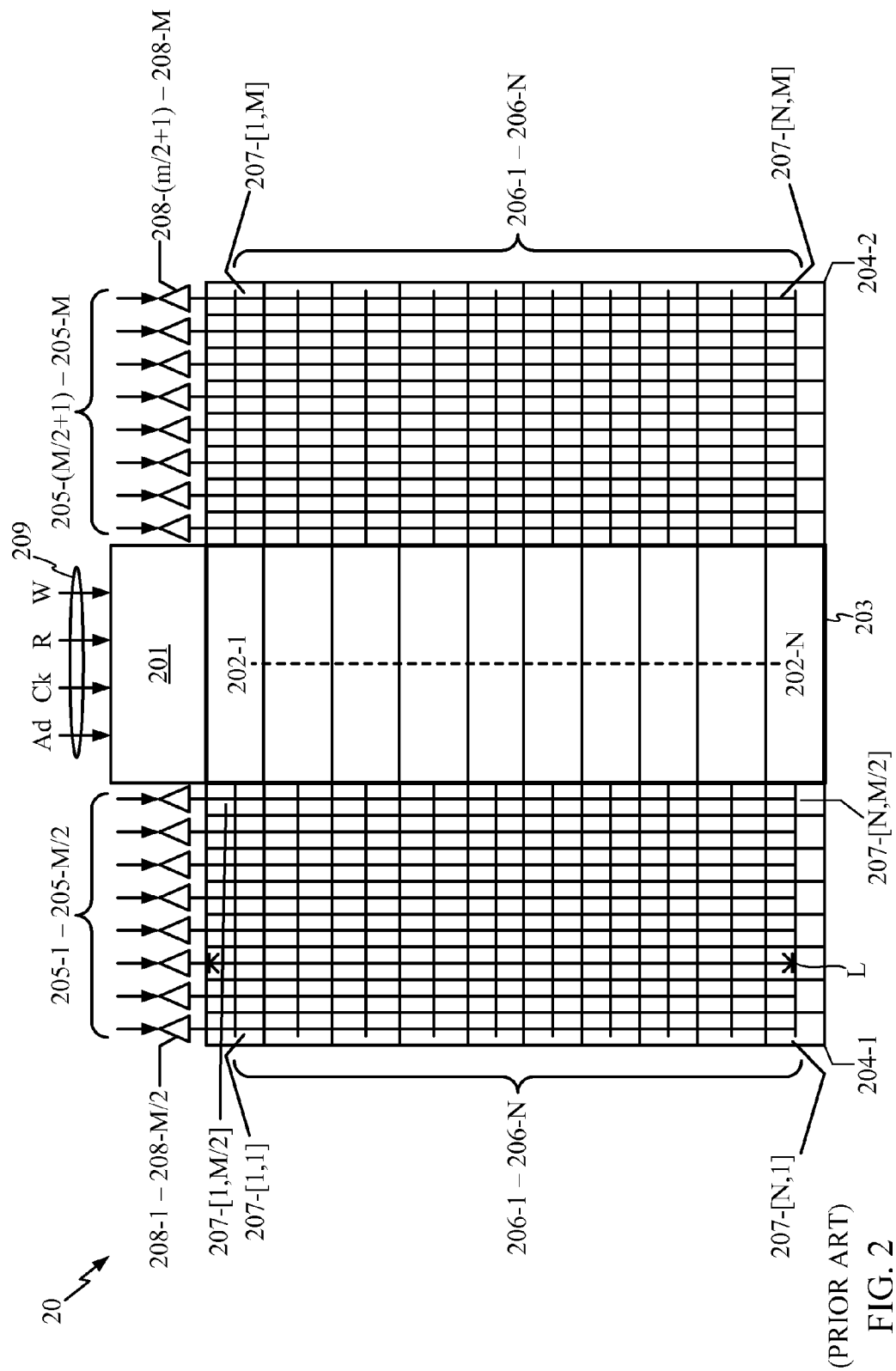
FIG. 2 is a block diagram illustrating a standard memory.

Turning now to FIG. 2, a block diagram is shown illustrating a standard memory 20. The memory 20 comprises a pre-decoder 201, a decoder 203, and sub-arrays 204-1 and 204-2. The sub-array 204-1 has bit lines 205-1-205-M/2 and word lines 206-1-206-N. At the intersection of each of bit lines 205-1-205-M/2 and word lines 206-1-206-N are memory cells 207-[1,1]-207-[N,M/2]. Similarly, the sub-array 204-2 comprises the memory cells 207-[1, (M/2+1)]-207-[N,M] located at the intersection of the bit lines 205-(M/2+1)-205-M and the word lines 206-1-206-N. The decoder 203 includes word line drivers 202-1-202-N that will drive the selected one of the word lines 206-1-206-N during read and write processing. Similarly, the bit line drivers 208-1-208-M/2 and 208-(M/2+1)-208-M drive bit lines 205-1-205-M/2 and 205-(M/2+1)-205-M during read and write processing. Each of the bit lines 205-1-205-M has a length of 'L.'

The pre-decoder 201 receives input from an input interface 209, which, in the example embodiment depicted in FIG. 2, includes input ports Ad (Address), Ck (Clock), R (Read), and W (Write). The pre-decoder 201 provides an initial decoding to the input. The decoder 203 consumes the initially decoded output of the pre-decoder 201. Based on the address input received, the decoder 203 finds and activates the appropriate word line by activating the appropriate one of the word line drivers 202-1-202-N. This will activate each of the memory cells along the activated word line. The address will further be used to identify the appropriate bit line to activate using the appropriate one of bit line drivers 208-1-208-M/2 or 208-(M/2+1)-208-M. Depending on whether a read or write is being performed, the bit line will either cause data to be read from the memory cell or written into the cell.

Figure 3:
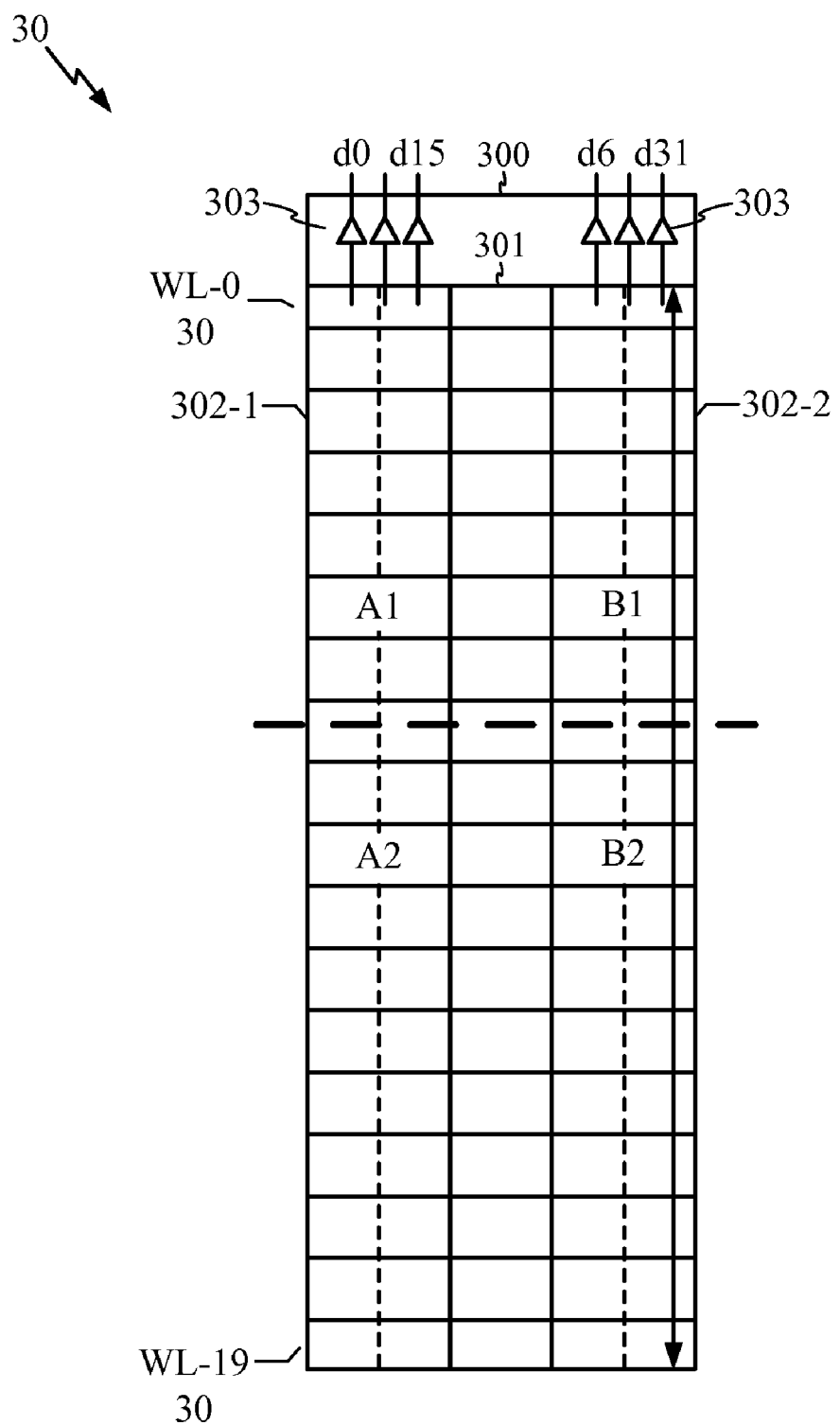
FIG. 3 is a block diagram illustrating another standard memory.

FIG. 3 is a block diagram illustrating a standard memory 30. The memory 30 is similar in structure to the memory 20 (FIG. 2) and includes memory cells at the intersections of the bit lines d0-d15, in the sub-array 302-1, and the bit lines d16-d31, in the sub-array 302-2, with the word lines $WL_{30}$-0-$WL_{30}$-191. The specific embodiment of the memory 30 has 32 bit lines. The address size will normally determine the maximum number of word lines to be included. The memory 30 uses an 8-bit address and illustrates 32 bit lines. An 8-bit address is sufficient to define an address space of up to 256 word lines. However, it is not always necessary to use all of the word lines in the maximum address space. The memory 30 is illustrated with 192 word lines across the sub-arrays 302-1 and 302-2.

The footprint of the memory 30, which is the amount of space or area taken up on the semiconductor material, forms a tall, rectangular shape. This shape is produced by the number of word lines, $WL_{30}$-0-$WL_{30}$-191, substantially exceeding the number of bit lines, d0-d31. This typical aspect ratio of currently manufactured memories creates long bit lines, which, in turn, results in large capacitances ($C_{30}$) that drive up the dynamic power consumption. Moreover, with the "tall and skinny" rectangular footprint, signal routing to different parts or blocks on the semiconductor chip can become problematic because such a rectangular shape does not maximize the coverage area on the chip. Such a memory could potentially block the communication signal from traveling in the straightest possible line between two points.

Rectangular footprints have additional shortcomings related to the physical manufacturing limitations in scaling these devices. When drawn in the computer-aided design environment, corners may appear very sharp in the graphical confines of the computer screen. Moreover, the computer design environment may allow for components to be "bent" or shaped to fit the non-uniform open areas of the semiconductor area. However, when it comes to the printing and lithography of those sharp-cornered or non-customary shapes into the actual semiconductor material, corners become rounded off. It is simply very difficult, if not impossible, for current lithographic technology to produce perfectly sharp corners or complicated shapes. With a designed rectangular or irregular shape, as it becomes smaller and smaller in the semiconductor material, the rounding eventually creates an object that will likely not be printable and/or etchable onto the semiconductor material.

Figure 4:
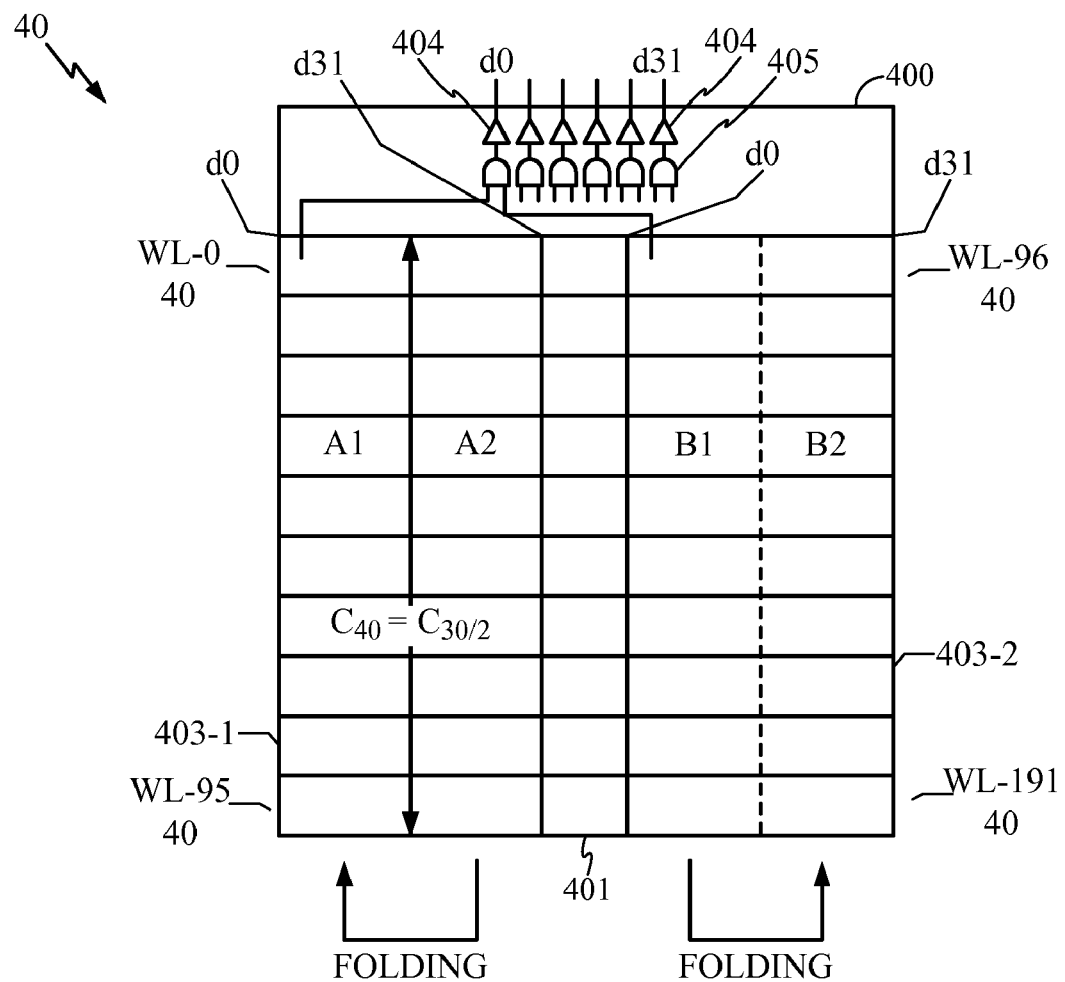
FIG. 4 is a block diagram illustrating a memory configured according to the teachings of this disclosure.

FIG. 4 is a block diagram illustrating a memory 40 configured according to one embodiment of the present invention. The memory 40 has the same total number of bit lines (d0-d31) and word lines ($WL_{21}$-0-$WL_{21}$-191) as the memory 30 (FIG. 3). In order to reduce the bit line capacitance in the memory 40, the memory 40 is figuratively "folded" over. In reference to memory 30 (FIG. 3), the sub-array 302-1 can be shown in halves, A1 and A2. When the memory is "folded" over, instead of A1 and A2 being on top of one another in a tall and skinny rectangle with half of the bit lines and all of the word lines, the sub-array 403-1 of the memory 40 is configured with A1 beside A2 in a shorter rectangle having an instantiation of all of the bit lines (d0-d31) and half of the word lines ($WL_{40}$-0-$WL_{40}$-95). The sub-array 403-2, similarly, configures B1 beside B2 with another instantiation of all of the bit lines (d0-d31) and the other half of the word lines ($WL_{40}$-96-$WL_{40}$-191). Because, each of the sub-arrays 403-1 and 403-2 has half of the word lines, the length of the bit lines d0-d31 is equal to half of the word line length of the memory 30 (FIG. 3). Half of the bit line length corresponds to half of the capacitance, $C_{40}=C_{30}/2$, which corresponds to half of the dynamic power. Moreover, the new footprint of the memory 40 results in a substantially square shape, which is much more beneficial to component design.

It should be noted that the various embodiments of the present invention may also be conceptually viewed as having the sub-array 403-1 comprising A1 beside B1. Both regions of A1 and B1 share the same word line addresses, but differ in the bit lines. Similarly, regions of A2 and B2 share the same word line addresses, but have different bit lines, so they may also be conceptualized as being beside each other in the sub-array 403-2.

The pre-decoder 400 includes bit line drivers 404 and multiplexers 405. The multiplexers 405 are used in determining which sub-array to access when a read or write process is initiated. Using input of a bit line identifier and at least a portion of the memory cell address, the multiplexers 405 will determine whether to access the sub-array 403-1 or 403-2. For example, the bit line d0, depending on the address range, could be in either the sub-array 403-1 or 403-2. Considering the configuration illustrated in FIG. 4, if the address range is 95 or less, then the sub-array 403-1 will be selected by the multiplexers 405. Otherwise, if the address range is 96 or greater, then the sub-array 403-2 will be selected by the multiplexers 405.

In order to implement the logic for the multiplexers 405, the division of the memory 40 is considered. With 192 word lines in the embodiment depicted in FIG. 4, an 8-bit address is used (bits "A0-A7", with A7 being the most significant bit (MSB)). The division of the memory 40 takes place in the middle of the total word lines provided for the memory 40, or at number 95. Therefore, a determination is first made as to how many of the MSBs of the 8-bit address will allow a continuous break at the transition point between the word line 95, $WL_{40}$-95, in the sub-array 403-1, and the word line 96, $WL_{40}$-96, in the sub-array 403-2. A single MSB could not be used for the memory 40 to determine which sub-array to access. As noted above, because the memory 40 uses an 8-bit address, the total possible address space is 256. If the single MSB, A7, were used, the calculated transition from accessing the sub-array 403-1 to accessing the sub-array 403-2 would occur at the $128^{th}$ word line, $WL_{40}$-127 (i.e., $2^7$) instead of 95, as the memory 40 is configured. Thus, the examined MSB would cause an incorrect mapping of the sub-arrays 403-1 and 403-2. The multiplexers 405 would be continuing to direct access to the sub-array 403-1 for the word lines 96-128 ($WL_{40}$-95-$WL_{40}$-127) even though the physical location of these word lines is in the sub-array 403-2 in the memory 40. In order to obtain an accurate transition at the word line 95 in the specific example illustrated in FIG. 4, the following logic formula controls selection by the multiplexers 405:

$$A7 \cdot \overline{A6} + \overline{A7} \cdot A6 \cdot A5$$

Therefore, the multiplexers 405 will signal to select the sub-array 206-1 until it detects the three (3) MSBs of the address are 0-1-1 or the two (2) MSBs are 1-0. When either of those two combinations are encountered, the multiplexers 405 will signal to the select sub-array 206-2.

It should be noted that in various additional and/or alternative embodiments of the present invention, the specific logic formula used by the multiplexers will reflect the division selected between the sub-arrays and the total number of word lines used by the particular memory. For example, in a memory utilizing 256 word lines and an 8-bit address, and two sub-arrays are selected each having exactly one-half of the total word lines, then only the MSB, A7, would be examined. In such an embodiment, if A7 is 0 then the desired bit line will be in the first sub-array, otherwise, the desired bit line will be in the second sub-array.

In practice, not all of the available memory capacity may be necessary. In a second example, where an 8-bit address is used and only 128 word lines are needed to provide sufficient memory capacity, the multiplexers would look to the last two MSBs, A7 and A6, with the logic function:

$$\overline{A7} \cdot A6 + A7 \cdot \overline{A6}$$

It should further be noted that the length of the bit lines in any particular sub-array in the various additional and/or alternative embodiments of the present invention may be further reduced by additional "folding" or configuring. The embodiments of the present invention are not limited solely to the configuration depicted in FIG. 4.

Figure 5:
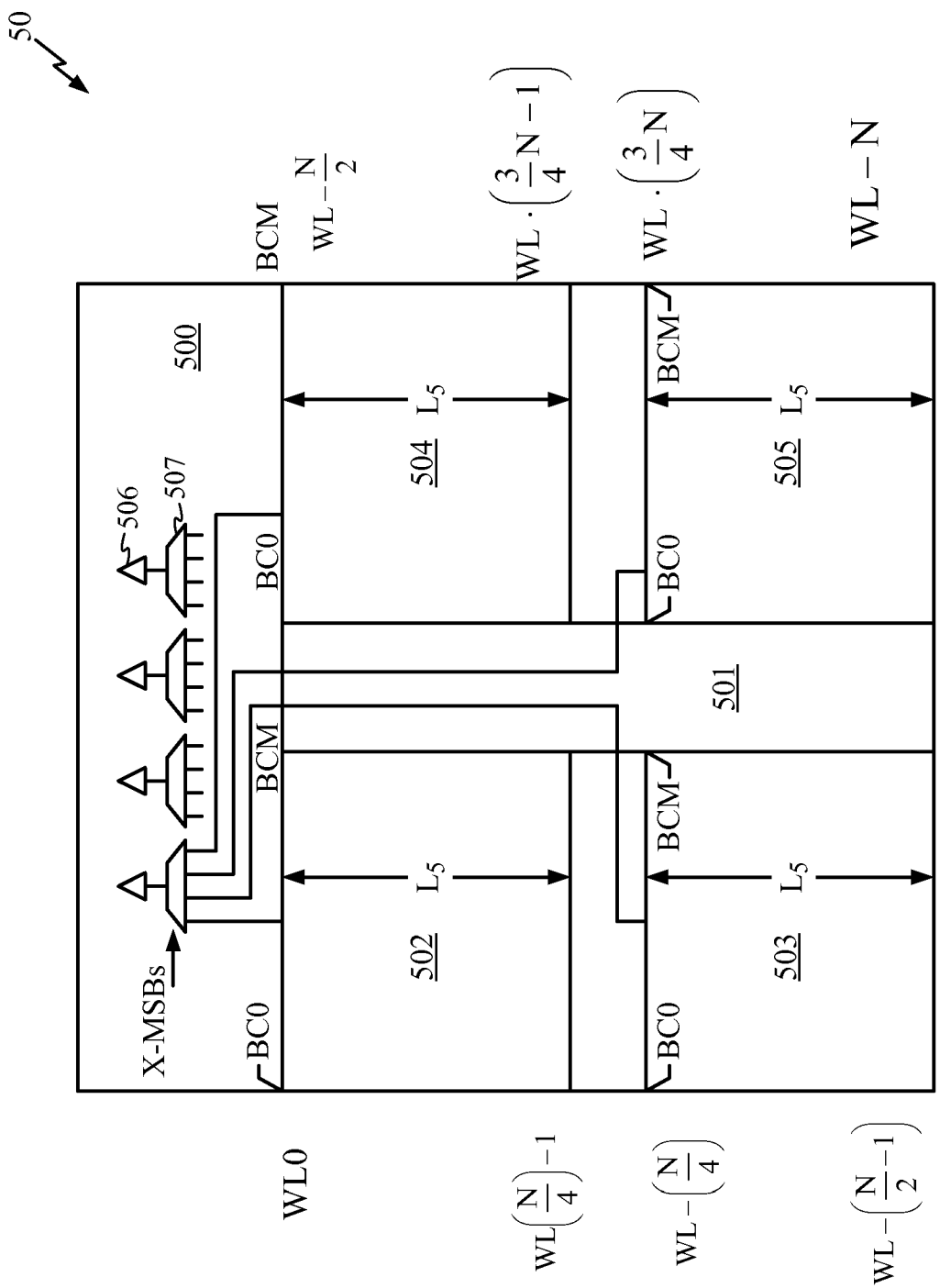
FIG. 5 is a block diagram illustrating another memory configured according to the teachings of this disclosure.

FIG. 5 is a block diagram illustrating a memory 50 configured according to one embodiment of the present invention. The memory 50 is made up of a pre-decoder 500, including bit line drivers 506 and multiplexers 507, a common decoder 501, and sub-arrays 502-505. Instead of "folding" the memory sub-arrays once, as shown in FIG. 4, the memory 50 is configured with its sub-arrays "folded" multiple times, e.g., twice, resulting in four sub-arrays, the sub-arrays 502-505. As noted before, "folding" actually means configuring each of sub-arrays 502-505 to have a complete set of bit lines, BL-0-BL-M, but only a portion of the total number of addressable word lines, WL-0-WL-N. As illustrated in FIG. 5, the sub-array 502 has the word lines WL-0-WL-(N/4−1), the sub-array 503 has the word lines WL-(N/4)-WL-(N/2−1), the sub-array 504 has the word lines WL-(N/2)-WL-(¾N−1), and the sub-array 505 has the word lines WL-(¾N−1)-WL-N.

By further dividing the number of word lines in each of the sub-arrays 502-505, the corresponding bit lines, BL-0-BL-M, are shorter, i.e., length $L_5$. In comparison to the memory 20 (FIG. 2), $L_5=L/4$. Thus, the memory 50 would have one-quarter the capacitance and one-quarter of the dynamic power requirements as the memory 20 (FIG. 2). In comparison to the memory 40 (FIG. 4), if each of the variables were the same, the capacitance of the memory 50 based on the length, $L_5$, would be equivalent to ½ of $C_{40}$.

The pre-decoder 500 handles accessing the additional sub-arrays through the multiplexers 507. Using input of the bit line number and word line address, the multiplexers 507 are able to accurately select the correct one of the sub-arrays 502-505. The multiplexers 507 examine a given set of MSBs of the word line address. The specific number of MSBs to be examined will have been determined based on the number of word lines planned for the memory as well as the division points planned for each sub-array.

Figure 6:
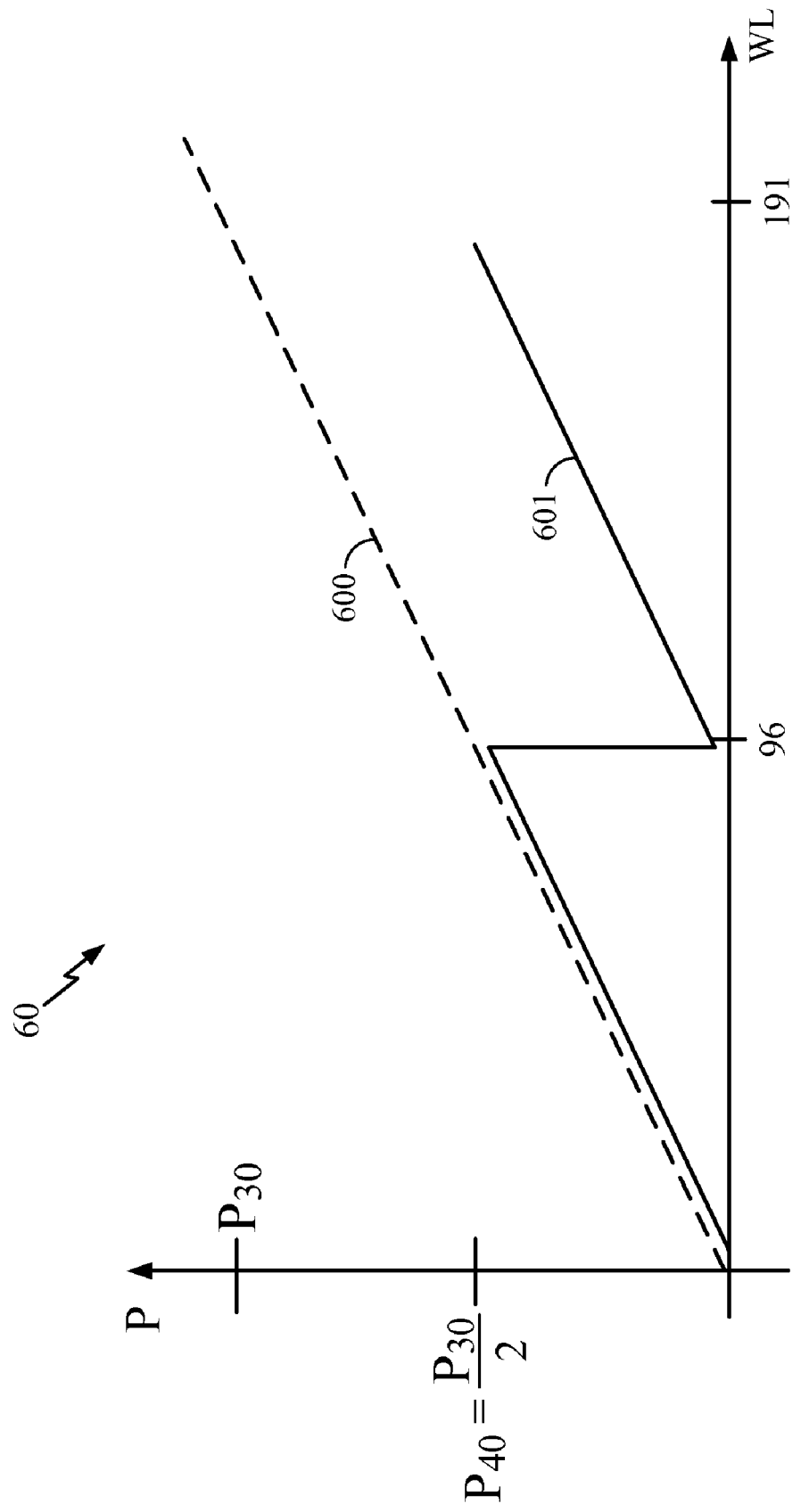
FIG. 6 is a plot comparing the dynamic power of a standard memory and one embodiment of a memory configured according to the teachings of this disclosure.

FIG. 6 is a plot comparing the dynamic power of the memory 30 of FIG. 3 compared against the dynamic power of the memory 40 of FIG. 4. Plot 600 represents the dynamic power as memory cells with increasing word lines are accessed in the memory 30. As the word line address becomes larger for the accessed memory cell in the memory 30, the length of the bit lines d0-d15 becomes greater, which results in a substantially linear dynamic power consumption from 0 to $P_{30}$. Plot 601 represents the dynamic power consumption as memory cells are accessed with increasing word lines in the memory 40. As may be seen in Plot 601, the dynamic power consumption of the memory 40 begins to increase substantially linearly in the same manner as Plot 600. However, when the word line 96 is reached, the dynamic power drops down again to a similar level for word line 0, because the bit line length drops down immediately to the initial length. The maximum power for the memory 40 is shown as $P_{40}$, which is equivalent to $P_{30}/2$, before falling at the word line 96. Plot 601 then further shows the dynamic power steadily increasing again until reaching the last word line, the word line 191. Here again, at the word line 191, the dynamic power consumption of the memory 40 is $P_{40}$ or $P_{30}/2$. Thus, the overall dynamic power for the memory 40, configured according to one embodiment of the present invention, is approximately half the dynamic power of the memory 30.

Figure 7:
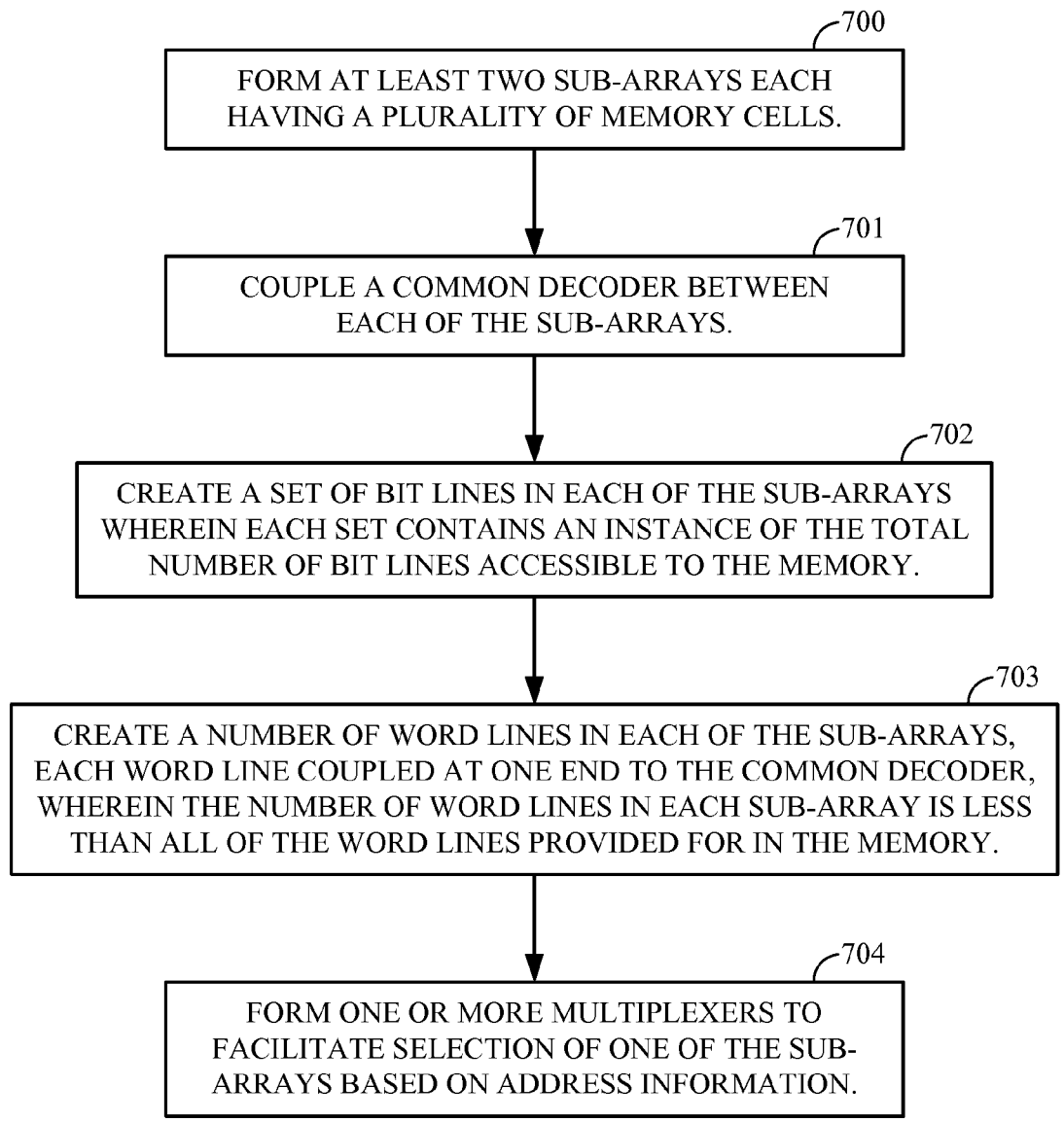
FIG. 7 is a flowchart illustrating example blocks for implementation of one embodiment of the teachings of this disclosure.

FIG. 7 is a flowchart illustrating example blocks implemented for creating a memory structure configured according to one embodiment of the present invention. In block 700, at least two sub-arrays are formed, each having multiple memory cells. A common decoder is coupled, in block 701, between each of the sub-arrays. In block 702, a set of bit lines is created in each of the sub-arrays wherein each set contains an instance of the total number of bit lines accessible to the memory. A number of word lines are created in each of the sub-arrays, in block 703. Each word line is coupled at one end to the common decoder. The number of word lines in each sub-array is less than all of the word lines provided for in the memory. In block 704, one or more multiplexers is formed and configured to facilitate selection of one of the sub-arrays based on address information.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory comprising:
a plurality of interface ports;
a first sub-array coupled to a plurality of bit lines of the memory and coupled to a first consecutive plurality of word lines of the memory;
a second sub-array coupled to the plurality of bit lines of the memory and coupled to a second consecutive plurality of word lines of the memory;
a decoder coupled to said first sub-array and said second sub-array, and coupled to said plurality of interface ports, said decoder configured to control said first consecutive plurality of word lines and the second consecutive plurality of word lines; and
a multiplexer coupled to each of said plurality of interface ports, wherein said multiplexer is operable to cause selection of one of said first sub-array and the second sub-array based upon an address of a memory cell received at one or more of said plurality of interface ports.

2. The memory of claim 1 wherein said first consecutive plurality of word lines comprises a first half of said of word lines of said memory, and the second consecutive plurality of word lines comprises a second half of the word-lines of the memory.

3. The memory of claim 1 further comprising:
a predecoder coupled between said plurality of interface ports and said decoder, wherein said predecoder processes said information for operation of said decoder.

4. The memory of claim 1 wherein each of said one or more of said plurality of interface ports comprise at least two of:
an address port;
a clock port;
a read port; and
a write port.

5. The memory of claim 1 wherein a physical configuration of said at least two sub-arrays, said decoder, and said multiplexer provides a footprint of said memory that is substantially square.

6. The memory of claim 1 wherein said first plurality of word lines is less than a total number of word lines of said memory.

7. The memory of claim 1 wherein a set of most significant bits (MSBs) of said address is used by said multiplexer to select said one of said first sub-array and the second sub-array.

8. The memory of claim 7 wherein said set of MSBs is selected based on one of said first consecutive plurality of word lines and the second consecutive plurality of word lines.

9. The memory of claim 7 wherein said set of MSBs comprises a minimum number of MSBs that specifically identify a transition point between said first sub-array and the second sub-array.

10. A memory comprising:
a memory interface;
a decoder coupled to said memory interface;
a first memory block coupled to said decoder, said first memory block comprising:
a first set of bit lines coupled to all bit lines of said memory; and
a first set of word lines comprising a first consecutive sub-set of all word lines of said memory;
a second memory block coupled to said decoder, said second memory block comprising:
a second set of bit lines coupled to all bit lines of said memory; and
a second set of word lines comprising a second consecutive sub-set of all word lines, the second set of word lines excluding the first set of word lines; and
a selector coupled to said memory interface and configured to facilitate selection of one of said first or second memory blocks responsive to information received at said memory interface.

11. The memory of claim 10 further comprising:
a pre-decoder coupled between said memory interface and said decoder.

12. The memory of claim 10 wherein said memory interface comprises a plurality of input/output ports, wherein each of said plurality of input/output ports comprises one of: an address port, a clock port, a read port, or a write port.

13. The memory of claim 10 wherein a footprint of said memory is substantially square.

14. The memory of claim 10 wherein said information comprises a set of most significant bits (MSBs) of an address for one of said set of all word lines.

15. The memory of claim 10 wherein said set of MSBs correspond to a transition point between said first and second sets.

16. The memory of claim 10 further comprising:
one or more additional memory blocks coupled to said decoder, said one or more additional memory blocks comprising:
an additional set of bit lines coupled to all bit lines; and
an additional set of consecutive word lines comprising an additional sub-set of all word lines of the memory;
wherein said selector further selects one of said first or second memory blocks or one of said one or more additional memory blocks responsive to said information received.

* * * * *